United States Patent [19]

Ogino

[11] Patent Number: 5,238,875
[45] Date of Patent: Aug. 24, 1993

[54] METHOD OF PRODUCING A BONDED WAFER

[75] Inventor: Nobuyoshi Ogino, Musashino, Japan

[73] Assignee: Shin-Etsu Handotai Co., Ltd., Japan

[21] Appl. No.: 754,754

[22] Filed: Sep. 4, 1991

[30] Foreign Application Priority Data

Sep. 6, 1990 [JP] Japan .................................. 2-236257

[51] Int. Cl.⁵ .......................................... H01L 21/302
[52] U.S. Cl. ..................................... 437/225; 437/11;
437/939; 148/DIG. 12; 148/DIG. 135
[58] Field of Search ................. 437/225, 974, 976, 11,
437/977, 739, 10; 156/DIG. 66; 148/DIG. 12,
DIG. 135, DIG. 127, DIG. 60

[56] References Cited

U.S. PATENT DOCUMENTS

| | | | |
|---|---|---|---|
| 4,401,506 | 8/1983 | Otsuka | 156/612 |
| 4,509,990 | 4/1985 | Vasude | 357/91 |
| 4,878,957 | 11/1989 | Yamaguchi et al. | 437/974 |
| 4,888,304 | 12/1989 | Nakagawa et al. | 437/974 |
| 4,983,251 | 1/1991 | Haisma et al. | 148/DIG. 12 |
| 5,028,558 | 7/1991 | Haisma et al. | 148/DIG. 12 |
| 5,071,785 | 12/1991 | Nakazato et al. | 433/974 |

FOREIGN PATENT DOCUMENTS

| | | | |
|---|---|---|---|
| 0045047 | 4/1981 | Japan | 437/10 |
| 56-80139 | 7/1981 | Japan | 437/10 |
| 58-180028 | 10/1983 | Japan | 437/10 |
| 59-52841 | 3/1984 | Japan | 437/10 |
| 0030247 | 2/1989 | Japan | 437/10 |

OTHER PUBLICATIONS

Silicon Processing for the VLSI Era; vol. 1, Wolf et al pp. 44-47, 61-66; 1986.
Gettering Utilizing Implant Damage and Highly Disordered Epitaxial Layer; Poponiak et al; pp. 2052-2053; IBM Tech. Dis. Bulletin; vol. 19 No. 6; Nov. 1976.
Oxidation Induced Stacking Faults in N- and P-Type (100) Silicon; Murarka et al; Jour. of App. Phys.; vol. 48; No. 1; Jan. 1987; pp. 46-51.

Primary Examiner—Brian E. Hearn
Assistant Examiner—Michael Trinh
Attorney, Agent, or Firm—Townsend, Snider & Banta

[57] ABSTRACT

This invention provides a bonded wafer of the n/n+ or p/p+ step junction or the SOI configuration possessing an outstanding getter effect by bonding two wafers thereby forming a n/n+ or p/p+ stage junction or a SOI configuration and, prior to the bonding, incorporating in one of the wafer surfaces an oxidation-induced stacking fault capable of producing a gettering effect. When a semiconductor device is produced by forming necessary components on the second semiconductor wafer surface side of the bonded wafer of this invention, therefore, the leak current across the pn junction of the semiconductor device is decreased, the life time of the carrier is improved, and the yield of the semiconductor device is notably enhanced without reference to the discrimination between the MOS type and the bipolar type.

1 Claim, 3 Drawing Sheets

METHOD OF PRODUCING A BONDED WAFER

BACKGROUND OF THE INVENTION

1. Field of the Invention

This invention relates to a direct bonded wafer possessing a gettering effect or a bonded wafer of the SOI (silicon on insulator) configuration using an intervening dielectric layer and to a method for the production thereof.

2. Description of the Prior Art

In recent years, the wafers of the SOI (silicon on insulator) configuration have come to attract attention from the standpoint of the growing trend of semiconductor devices toward three-dimensional configuration, high voltage breakdown, and dielectric separation between adjacent components. The SOI configuration comprises two layers of single crystal silicon Wafer and an silicon oxide film as an insulating film interposed between the two layers. As a means of producing a wafer of the SOI configuration, Japanese Patent Publication SHO 62(1987)-34,716 discloses a method which produces an integral thin film of single crystal silicon by forming a thermal oxide film on the surface of a single crystal wafer, providing the single crystal silicon wafer at a peripheral part thereof with a single crystal projection integrally continuing therewith, coating the thermal oxide film with a polycrystalline or amorphous silicon film, causing an energy beam such as an electron beam or a laser beam to irradiate the silicon film linearly and unidirectionally thereby fusing the silicon film linearly, and cooling and solidifying the fused silicon film. This method, however, is in a true sense such that though the formation of a single crystal is partly accomplished, the production of a single crystal silicon film fit for actual use is attained only with difficulty from the interaction between the fused silicon and the oxide film.

As a means of overcoming this problem and allowing production of a wafer of the SOI configuration by bonding, a method which produces a bonded wafer by directly bonding two single crystal silicon wafers having an silicon oxide film formed on the surface thereof each and then reducing one of the silicon wafers into a thin film by etching away the free surface region thereof has been disclosed [Tadayoshi Enomoto: "Nikkei Microdevices," No. 15, page 39 (September, 1986); and Lasky, Stiffer, White, and Abernathy: "Digest of the IEEE Int. Elec. Device Meeting (IEDM)," page 688 (December 1985)]. To be specific, a high-concentration $n^+$ silicon substrate having a low-concentration $n^-$ epitaxial layer formed on the surface thereof and a low-concentration silicon substrate for supporting are prepared and thermal oxide films are formed one each on the opposed surface of the two substrates. Then, the coated substrates are mutually superposed, contacted closely against each other, and heat-treated in an oxidizing atmosphere at 700° C. thereby to complete bonding of the $SiO_2$, layers. The variation of the silicon oxide film in thickness from the level of natural silicon oxide film to 520 nm has been demonstrated experimentally. Incidentally, the mechanism of the bonding is explained as follows. First, when the $O_2$ gas present between the wafers is converted into $SiO_2$, a vacuum part is partially produced and the wafers are forced to stick fast in part to each other. Once this fast stick is produced, the bonding between the wafers is eventually completed through the reactions of hydrogen bonding and dehydration condensation. Then, the SOI configuration is completed by removing the $n^+$ silicon substrate through selective etching while allowing the $n^-$ epitaxial layer to remain intact.

Now, that efforts are directed to producing semiconductor devices with enhanced density and increased fineness and expectations are entertained of further improvement in overall characteristic properties and in productional efficiency, the gettering process has been finding extensive utility as a technique which, by giving a treatment of a certain kind to a semiconductor wafer either in the course of device production or in the preparation of a starting material, imparts an ability to inactivate defects or harmful impurities to the semiconductor wafer. It has been known that the gettering treatment decreases the leak current across the pn junction, improves the life time of the carrier, and notably enhances the yields of the MOS device and the bipolar device alike.

The method which produces a wafer of the SOI configuration by the bonding described above, however, has the problem that it cannot expect the gettering effect because no special attention is paid to controlling the amount of impurities which exist on the surfaces of junction prior to their bonding.

The $n/n^+$ or $p/p^+$ junction in the bonded wafer of the type obtained by giving a mirror finish to the main surfaces on one side of each of the two single crystal silicon wafers, directly bonding the mirror surfaces of the wafers, and reducing one of the wafers into a thin layer is a product of ideal step junction and, therefore, is advantageous for design and fabrication of semiconductor devices over the conventional epitaxial junction. The bonded wafers of this type are not necessarily fully satisfactory in terms of purity.

SUMMARY OF THE INVENTION

This invention, with a view of the solution of the disadvantage of the prior art described above, provides a bonded wafer of the $n/n^+$ or $p/p^+$ step junction or the SOI configuration possessing an outstanding getter effect by bonding two wafers thereby forming a $n/n^+$ or $p/p^+$ step junction or a SOI configuration and, prior to the bonding, incorporating in one of the wafer surfaces an oxidation-induced stacking fault capable of producing a gettering effect.

The present invention, in its first aspect, resides in providing a bonded wafer, characterized by having a first semiconductor wafer and a second semiconductor wafer bonded to each other either through the medium of an insulating layer or directly without use of an insulating layer and having a thin layer of thermal oxidation-induced stacking fault formed in the surface region of the second semiconductor wafer.

This invention further provides a method for the production of a bonded wafer, characterized by giving to the mirror finished surface of a second semiconductor wafer a pretreatment for incorporation of a thermal oxidation-induced stacking fault, then forming a thermal oxide film on the second semiconductor wafer, subsequently superposing on the mirror finished surface of a first semiconductor wafer the pretreated surface side of the second semiconductor wafer through the medium of the aforementioned thermal oxide film, and heating the first and second semiconductor wafers thereby completing bonding thereof.

DETAILED DESCRIPTION OF THE INVENTION

Figure 1:
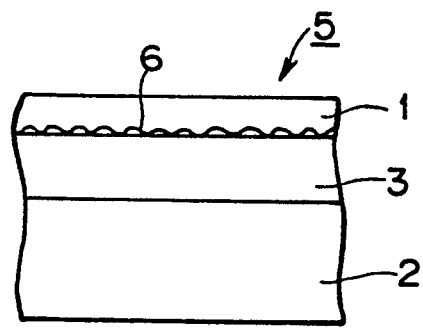
FIG. 1 is a cross section illustrating the construction of one example of the bonded wafer of this invention and FIGS. 2a, 2b, 2c, 2d, 2e, 2f, 2g, and 2h and explanatory diagrams depicting the process for the production of the bonded wafer of the present invention.

The procedure which comprises forming a thermal oxidation-induced stacking fault on the surface of the second semiconductor wafer and further giving a mirror polish to the same surface thereby reducing the thickness of the stacking fault layer is desirable in respect that, when the second semiconductor wafer is further polished off for reduction in thickness, crystal deterioration of the second wafer is precluded, which would be otherwise possibly caused by the as induced stacking fault on the surface.

In the bonded Wafer of the present invention, since the thin stacking fault layer is interposed between the second semiconductor wafer and the insulating layer, the stacking fault constitutes itself the site for deposition of impurity atoms and the center of gettering. In a semiconductor device which is produced by performing various treatments on the surface of the second semiconductor wafer (the one not taking part in bonding), therefore, the leak current across the pn junction is decreased, the life time of the carrier is improved, and the yield of the semiconductor device is notably enhanced without reference to the discrimination between the MOS type and the bipolar type.

The gettering effect of this stacking fault similarly contributes to enhancing the characteristic properties of the semiconductor device which uses a direct bonded wafer of the $n/n^+$ or $p/p^+$ step junction type excluding the interposition of a thermal oxide film.

Then, in the method of this invention for the production of the bonded wafer, the mirror finished surface of the second semiconductor wafer, on being subjected to the pretreatment for incorporation of thermal oxidation-induced stacking fault, forms minute crystal defects including microcracks and then the wafer, on being heat-treated, admits oxidation-induced stacking fault (OSF) at the sites of the minute defects. Then the bonding of the first semiconductor wafer and the second semiconductor wafer is accomplished without use of any adhesive agent when the preprocessed surface of the second semiconductor wafer is superposed on the mirror finished surface of the first semiconductor wafer through the medium of the thermal oxide film and the first and second semiconductor wafers in the superposed state are heated.

The procedure which comprises introducing a thermal oxidation-induced stacking fault into the surface of the second semiconductor wafer and thereafter polishing off partly the resultant stacking fault-containing surface thereby giving rise to a thin stacking fault layer renders it easy to control the gettering ability of the stacking fault within a predetermined range. Even when the second semiconductor wafer is reduced to a thickness on the order of submicrons, the stacking fault avoids deteriorating the crystallinity of the thin single crystal layer of the second semiconductor wafer and the gettering effect enables the thin single crystal layer to be purified to a high degree.

Further, for the formation of the minute crystal defects by the aforementioned pretreatment for incorporation of thermal oxidation-induced stacking fault, such a mechanical or physical method as sand blast or ion implantation may be used.

When the minute crystal defects are formed in advance in the interface of bonding, though they manifest the gettering effect after the bonding of the wafers, they cease to exist on exposure to the heat treatment which is performed during the process of manufacture of a semiconductor device. They are desired, therefore, to be altered to the stacking fault by thermal oxidation.

The procedure which comprises bonding the first and second semiconductor wafers and thereafter polishing off the surface of the second semiconductor wafer thereby reducing this wafer into a thin film is far more efficient in producing the thin film of the second semiconductor wafer than the conventional etch-back process and obviates the necessity for using an expensive apparatus.

EXAMPLE

Now, one working example of this invention will be described below with reference to the accompanying drawings.

FIG. 1 is a cross section illustrating the construction of a bonded wafer of the SOI configuration according with the present invention.

In FIG. 1, 1 stands for a bond wafer (second semiconductor wafer), 2 for a base wafer (first semiconductor wafer), 3 for an silicon oxide film (insulating layer), and 6 for a stacking fault.

The bonded wafer constructed as illustrated in FIG. 1 is produced through the steps of FIGS. 2a to 2h.

Figure 2A:
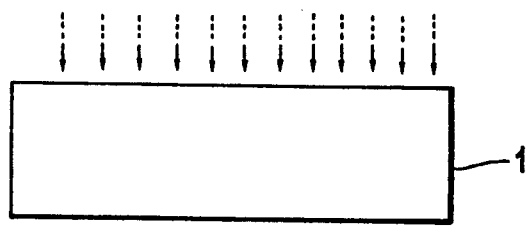

First, the mirror finished surface of a Si bond wafer 1 (second semiconductor wafer) destined to form the surface for the formation of a given device is subjected to a pretreatment for incorporation of thermal oxidation-induced stacking fault [FIG. 2a]. This treatment effected by sand blast or ion implantation is aimed at producing minute crystal defects including microcracks in the mirror finished surface.

Figure 2B:
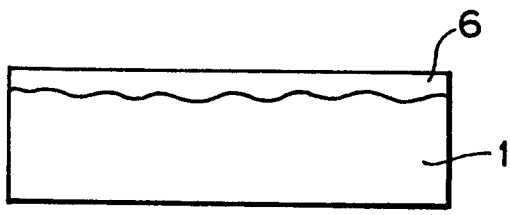

The pretreatment is then followed by a heat-treatment. By this heat-treatment, an oxidation-induced stacking fault (OSF) is introduced into the sites of minute crystal defects including microcracks as illustrated in FIG. 2b.

These minute crystal defects require adjustment in areal density, depth, etc. When specular-faced wafers are directly bonded or when they are bonded through the medium of an intervening thermal oxide film, since the roughness of their surfaces is required to be not more than 0.5 nm, the surfaces in Which the thermal oxidation-induced stacking fault has been already formed are desired to be given mirror polishing for the purpose of smoothening. This mirror polishing is effective also in adjusting the thickness of the stacking fault.

Particularly when the formation of the thermal oxide film and the generation of the stacking fault are simultaneously attained on the surface of the second semiconductor wafer by the pretreatment and the pretreated surface is immediately bonded to the surface of the first semiconductor wafer through the medium of the oxide film, this pretreatment must be performed attentively lest it should disrupt the surface smoothness mentioned above.

Figure 2C:
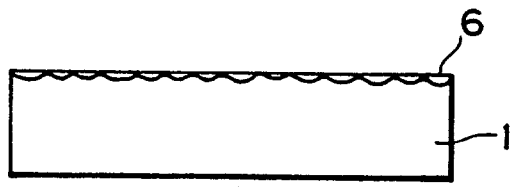
Figure 2D:
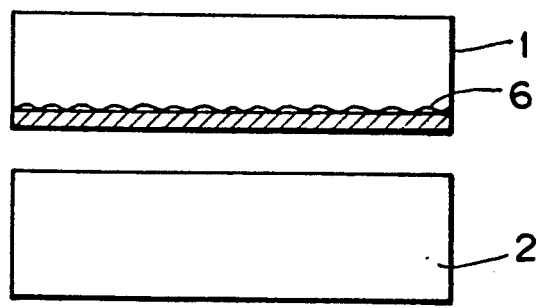
Figure 2E:
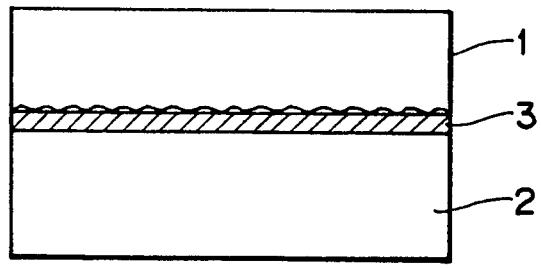

Then, the surface which has introduced the stacking fault is removed by polishing so that the stacking fault is allowed to remain only in part as illustrated in FIG. 2c. At this time, the wafer in process is subjected to a destructive testing for determination of areal density and distribution depth of the stacking fault. Then, the wafer is given an oxidizing treatment to form thereon a thermal oxide film about 500 nm in thickness. Separately, a Si base wafer 2 of single crystals destined to form a base member is prepared. This Si base wafer 2 has the surface thereof polished to mirror finish of a roughness of not more than 0.4 µm in advance.

The areal density of $10^4/cm^2$ suffices for the aforementioned stacking fault. The distribution depth of the stacking fault is desired to be not more than 1/10 of the thickness of single crystal in the active region of the bonded wafer.

Figure 2F:
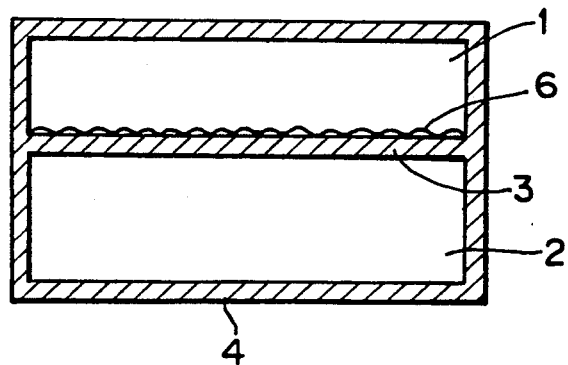
Figure 2G:
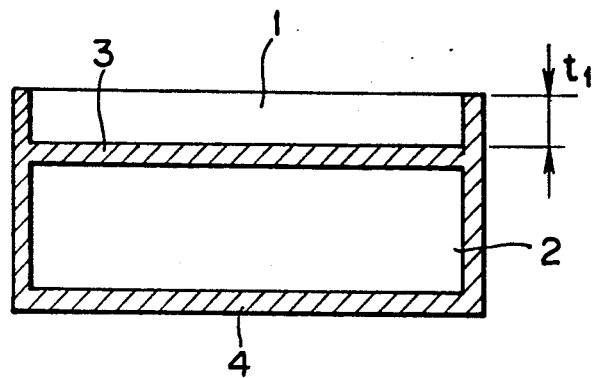

Then, the bond wafer 1 is superposed on and joined with the base wafer 2. The joined wafers 1, 2 are subjected to a treatment of thermal oxidation in a $N_2$ atmosphere or in an oxidizing atmosphere at a temperature of about 1,100° C. for a period of about 120 minutes to form an oxide ($SiO_2$) film 4 about 500 nm in thickness on the entire surfaces of the two wafers 1, 2 as illustrated in FIG. 2f.

Now, the integrally joined wafers 1, 2 are cooled. The surface of the bond wafer 1 on the upper side is prepolished (for primary polishing) until the wafer is reduced to a predetermined thickness, $t_1$ (6 µm, for example), and allowed to retain a margin (3 µm, for example) for final finish. Since the thermal contraction of the wafers 1, 2 both formed of single crystal of Si is different from that of the oxide ($SiO_2$) films 3, 4, residual stress is accumulated in these wafers 1, 2 after they have been cooled.

In the present working example, since the upper and lower surfaces of the base wafer 2 are coated with the silicon oxide films 3, 4 which have a substantially identical thickness (about 500 nm) at the end of the prepolishing mentioned above, the residual stress is substantially equal on the upper and lower surfaces of the base wafer 2 and the of thermal contractions of the upper and lower surfaces are consequently substantially equal. Thus, the otherwise possible deformation of the base wafer 2 is precluded.

The bond wafer 1 which has been prepolished to the thickness, $t_2$, as described above [FIG. 2g] is further reduced by secondary polishing to a thickness, $t_2$ (3 µm, for example). As a result, a bonded wafer 5 is obtained as illustrated in FIG. 2h.

Figure 2H:
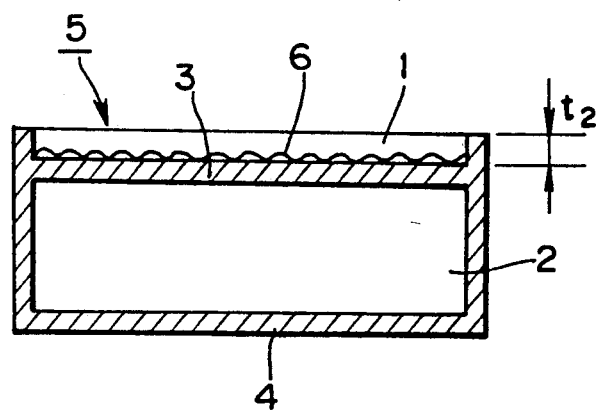

The bonded wafer 5 illustrated in FIG. 2h and FIG. 1 possesses the SOI configuration and excels in the gettering effect.

The description so far given has been limited to the bonded wafer of the SOI configuration. It ought to be easily understood from the description that the direct bonded wafer of the $n/n^+$ or $p/p^+$ step junction will acquire the same gettering effect as depicted above.

As clearly noted from the description given above, the bonded wafer of the present invention has a thin stacking fault layer formed on the bonding surface of the second semiconductor wafer and this stacking fault constitutes itself the site for deposition of impurity atoms and the center of gettering. When a semiconductor device is produced by forming necessary components on the second semiconductor wafer surface side of the bonded wafer of this invention, therefore, the leak current across the pn junction of the semiconductor device is decreased, the life time of the carrier is improved, and the yield of the semiconductor device is notably enhanced without reference to the discrimination between the MOS type and the bipolar type.

Further, in accordance with the method of this invention for the production of the bonded wafer, the $n/n^+$ or $p/p^+$ step junction wafer or the bonded wafer of the SOI configuration having the component wafers bonded strongly and possessing a getter effect is obtained by merely superposing the two semiconductor wafers without use of any adhesive agent and subsequently heating the superposed wafers.

What is claimed is:

1. A method of producing a bonded wafer comprising:

forming a thermal oxide film on a mirror finished surface of a second semiconductor wafer;

superimposing the mirror finished surface of said second semiconductor wafer through the medium of said thermal oxide film on a mirror finished surface of a first semiconductor wafer;

heating said first and second semiconductor wafers in order to integrate them;

said method characterized in that stacking faults are formed on the mirror finished surface of said second semiconductor wafer with a density of no lower than $10^4 cm^2$ in advance of the formation of said thermal oxide film;

wherein said stacking faults are formed by forming minute crystal defects of the mirror finished surface of said second semiconductor wafer and thereafter thermally oxidizing the mirror finished surface of said second semiconductor wafer to said first semiconductor wafer directly through said oxide film; and wherein a layer including said stacking faults formed in the mirror finished surface of said second semiconductor wafer is thinned and said thermal oxide film is formed on said layer followed by bonding said second semiconductor wafer to said first semiconductor wafer.

* * * * *